(12) United States Patent
Ikeda et al.

(10) Patent No.: US 7,550,020 B2
(45) Date of Patent: Jun. 23, 2009

(54) CHEMICAL MECHANICAL POLISHING AQUEOUS DISPERSION AND CHEMICAL MECHANICAL POLISHING METHOD

(75) Inventors: Norihiko Ikeda, Chuo-ku (JP); Kazuo Nishimoto, Chuo-ku (JP); Masayuki Hattori, Chuo-ku (JP); Nobuo Kawahashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 497 days.

(21) Appl. No.: 11/180,619

(22) Filed: Jul. 14, 2005

(65) Prior Publication Data

US 2006/0010781 A1 Jan. 19, 2006

(30) Foreign Application Priority Data

Jul. 15, 2004 (JP) .............................. 2004-208609

(51) Int. Cl.
*C09G 1/02* (2006.01)
*C09G 1/04* (2006.01)

(52) U.S. Cl. .............................. 51/307; 51/309; 51/298; 106/3; 438/691; 438/692; 438/693

(58) Field of Classification Search .................. 51/507, 51/309, 298, 307; 106/3; 438/690–694; 428/403, 404, 407
See application file for complete search history.

(56) References Cited

U.S. PATENT DOCUMENTS

| 5,876,490 | A | | 3/1999 | Ronay |
| 6,117,775 | A | * | 9/2000 | Kondo et al. ................. 438/690 |
| 6,582,761 | B1 | * | 6/2003 | Nishimoto et al. .......... 427/203 |
| 6,740,590 | B1 | | 5/2004 | Yano et al. |
| 2004/0132305 | A1 | * | 7/2004 | Nishimoto et al. .......... 438/690 |
| 2005/0164510 | A1 | | 7/2005 | Ikeda et al. |
| 2006/0010781 | A1 | | 1/2006 | Ikeda et al. |

FOREIGN PATENT DOCUMENTS

| CN | 1453328 A | 11/2003 |
| EP | 1 036 836 A1 | 9/2000 |
| EP | 1 104 778 A2 | 6/2001 |
| EP | 1 160 300 A2 | 12/2001 |
| JP | 60-235631 | 11/1985 |
| JP | 05-326469 | 12/1993 |
| JP | 09-270402 | 10/1997 |
| JP | 2000-109809 | 4/2000 |
| JP | 2000-252245 | 9/2000 |
| JP | 2000-269169 | 9/2000 |
| JP | 2001-007061 | 1/2001 |
| JP | 2001-185514 | 7/2001 |
| JP | 2001-323256 | 11/2001 |
| JP | 2002-204353 | 7/2002 |
| TW | 420716 B | 2/2001 |

OTHER PUBLICATIONS

U.S. Appl. No. 11/180,619, filed Jul. 14, 2005, Ikeda, et al.
U.S. Appl. No. 12/097,361, filed Jun. 13, 2008, Ikeda, et al.

* cited by examiner

*Primary Examiner*—Michael A Marcheschi
(74) *Attorney, Agent, or Firm*—Oblon, Spivak, McClelland, Maier & Neustadt, P.C.

(57) ABSTRACT

A chemical mechanical polishing aqueous dispersion comprises abrasives in a concentration of not more than 1.5% by mass, wherein the abrasives comprise ceria and have an average dispersed particle diameter of not less than 1.0 μm. A chemical mechanical polishing method comprises polishing an insulating film by the use of the chemical mechanical polishing aqueous dispersion. By the use of the chemical mechanical polishing aqueous dispersion, occurrence of polishing scratches can be suppressed without lowering a removal rate.

8 Claims, No Drawings

CHEMICAL MECHANICAL POLISHING AQUEOUS DISPERSION AND CHEMICAL MECHANICAL POLISHING METHOD

TECHNICAL FIELD

The present invention relates to a chemical mechanical polishing aqueous dispersion and a chemical mechanical polishing method. More particularly, the invention relates to a chemical mechanical polishing aqueous dispersion particularly useful for chemical mechanical polishing of insulating films in the process for manufacturing semiconductor devices.

BACKGROUND OF THE INVENTION

With enhancement of degree of integration and formation of more multi-layer interconnections in the semiconductor devices, storage capacities of memory devices have been greatly increased. This is supported by the advancement in the fine process technologies. In spite of formation of more multilayer interconnections, however, the chip size becomes larger and the number of processing steps is increased with the advancement in the fine process technologies, resulting in increase of chip cost. Under such circumstances, chemical mechanical polishing technique has been introduced into polishing of process films or the like and is paid attention. By adopting this chemical mechanical polishing technique, a large number of fine process technologies such as planarization have been embodied.

As one of such fine process technologies, shallow trench isolation, namely, so-called STI technology is known. In the STI technology, chemical mechanical polishing is carried out in order to remove an excess of an insulating layer formed on a wafer substrate. In this chemical mechanical polishing process, planarity of the polished surface is important, and on this account, various polishing agents have been studied.

For example, Japanese Patent Laid-Open Publication No. 5-326469/1993 and Japanese Patent Laid-Open Publication No. 9-270402/1997 disclose that by the use of an aqueous dispersion using ceria as abrasives in the chemical mechanical polishing step of STI, a high removal rate is achieved and a polished surface having relatively few polishing scratches is obtained. In Japanese Patent Laid-Open Publication No. 5-326469/1993, however, there is a problem that a large number of polishing scratches occur because inorganic particles having a large diameter are used as abrasives. In Japanese Patent Laid-Open Publication No. 9-270402/1997, there is a problem that a removal rate is slow because cerium oxide particles having a small average particle diameter are used as abrasives.

In recent years, as much finer and more multilayer interconnections of semiconductor devices have been developed, further improvement of yield or throughput of the semiconductor devices has been required. With such requirement, polishing that causes substantially no polishing scratches on a polished surface after chemical mechanical polishing and that provides a high removal rate has been desired.

With regard to decrease of polishing-scratches on the polished surface, it has been reported that surfactants, such as chitosan acetate, dodecylamine and polyvinyl pyrrolidone, are effective (see, e.g., Japanese Patent Laid-Open Publication No. 2000-109809, Japanese Patent Laid-Open Publication No. 2001-7061 and Japanese Patent Laid-Open Publication No. 2001-185514). According to these reports, the above surfactants are effective for the decrease of polishing scratches. However, the removal rate is lowered, and improvement of throughput has not been achieved yet.

Further, with regard to a polishing method in order to decrease polishing scratches on the polished surface and to provide a high removal rate, it has been reported that a polishing method in which cerium oxide particles are moderately aggregated in a specific average particle diameter and the aggregates are maintained in stable state is effective (see, e.g., Japanese Patent Laid-Open Publication No. 2000-252245). Moreover, it has been reported that a aqueous dispersion comprising inorganic particles and polymer particles having an average particle diameter not larger than that of the inorganic particles, and a aqueous dispersion comprising inorganic abrasives and anionic organic particles are effective (see, e.g., Japanese Patent Laid-Open Publication No. 2002-204353 and Japanese Patent Laid-Open Publication No. 2001-323256). In some materials of polished surfaces, however, by the use of the method or the aqueous dispersions, a large number of polishing scratches sometimes occur or a sufficient removal rate cannot be sometimes achieved.

OBJECT OF THE INVENTION

The present invention has been made in the light of such STI technique as mentioned above, and it is an object of the present invention to provide a chemical mechanical polishing aqueous dispersion which can suppress occurrence of polishing scratches without lowering a removal rate and a chemical mechanical polishing method for removing excess insulating film by the use of the aqueous dispersion in the shallow trench isolation process.

DISCLOSURE OF THE INVENTION

The chemical mechanical polishing aqueous dispersion according to the present invention comprises abrasives in a concentration of not more than 1.5% by mass, wherein the abrasives comprise composite particles obtained by mixing ceria and cationic organic particles and have an average dispersed particle diameter of not less than $1.0\,\mu m$, the amount of the cationic organic particles mixed being not more than 100 parts by mass relative to 100 parts by mass of the ceria.

Preferably, the chemical mechanical polishing aqueous dispersion further comprises an anionic water-soluble organic polymer.

The process for preparing the chemical mechanical polishing aqueous dispersion of the present invention preferably comprises mixing a water dispersion comprising ceria having an average dispersed particle diameter of less than $1.0\,\mu m$ in an amount of 100 parts by mass in terms of ceria with a water dispersion comprising cationic organic particles having an average dispersed particle diameter of less than $1.0\,\mu m$ in an amount of not more than 100 parts by mass in terms of cationic organic particles.

The chemical mechanical polishing method according to the present invention comprises polishing an insulating film using the chemical mechanical polishing aqueous dispersion.

The insulating film is preferably a PETEOS film, a HDP film, a silicon oxide film obtained by a thermal CVD method, a boron phosphorus silicate film or a fluorine doped silicate glass film.

DESCRIPTION OF THE PREFERRED EMBODIMENTS

Chemical Mechanical Polishing Aqueous Dispersion

Each component of the chemical mechanical polishing aqueous dispersion of the invention is described in detail hereafter.

The abrasives contained in the chemical mechanical polishing aqueous dispersion of the invention comprise ceria and have an average dispersed particle diameter of not less than $1.0\,\mu m$.

The abrasives comprising ceria and having an average dispersed particle diameter of not less than 1.0 μm may be any of abrasives so long as these requirements are satisfied, and for example, the abrasives are preferably composite particles comprising ceria and cationic organic particles.

The ceria can be obtained by, for example, heating a tetravalent cerium compound in an oxidizing atmosphere. The tetravalent cerium compound that is a raw material of the ceria is, for example, cerium hydroxide, cerium carbonate or cerium oxalate.

The ceria has an average dispersed particle diameter of smaller than 1.0 μm, preferably not smaller than 0.01 μm and smaller than 1.0 μm, more preferably not smaller than 0.02 μm and not larger than 0.7 μm, still more preferably not smaller than 0.04 μm and not larger than 0.5 μm. By the use of the ceria having an average dispersed particle diameter of this range, abrasives having an excellent balance between a removal rate and dispersion stability in the aqueous dispersion can be obtained. The average dispersed particle diameter can be measured by dynamic light scattering method, laser scattering diffractometry, observation by transmission electron microscope, or the like. Of these methods, measurement by laser scattering diffractometry is preferable because this method is easy and simple.

The ceria has a specific surface area of preferably 5 to 100 $m^2/g$, more preferably 10 to 70 $m^2/g$, still more preferably 10 to 30 $m^2/g$. By the use of the ceria having a specific surface area of this range, abrasives capable of providing excellent planarity can be obtained.

The cationic organic particles are organic particles having a cationic residue within the particles. Examples of the cationic residues include residues represented by the following formulas (1) to (4).

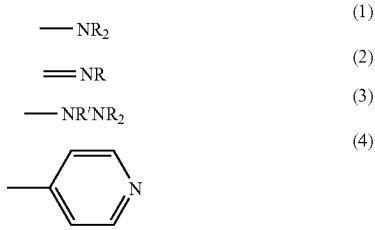

In the above formulas, each R is independently a hydrogen atom, an aliphatic hydrocarbon group of 1 to 30 carbon atoms or an aryl group of 6 to 30 carbon atoms, and each R is preferably a hydrogen atom or an alkyl group of 1 to 4 carbon atoms, more preferably a hydrogen atom or a methyl group. R' is a hydrogen atom, an aliphatic hydrocarbon group of 1 to 30 carbon atoms or an aryl group of 6 to 30 carbon atoms.

The cationic organic particles are not specifically restricted so long as they have such a cationic residue as described above, and for example, polymer particles having such a cationic residue as above, polymer particles to which a surfactant having a cationic residue has adhered and the like are preferably employable.

When the cationic organic particles are polymer particles having a cationic residue, the cationic residue can be positioned either or both of in the side chain and at the terminal of the polymer.

The polymer having a cationic residue in the side chain can be obtained by homopolymerization of a cationic monomer, copolymerization of two or more cationic monomers or copolymerization of a cationic monomer and another monomer.

The cationic monomer is, for example, an aminoalkyl group-containing (meth)acrylic ester, an aminoalkoxyalkyl group-containing (meth)acrylic ester or a N-aminoalkyl group-containing (meth)acrylic amide.

Examples of the aminoalkyl group-containing (meth)acrylic esters include 2-dimethylaminoethyl (meth)acrylate, 2-diethylaminoethyl (meth)acrylate, 2-dimethylaminopropyl (meth)acrylate and 3-dimethylaminopropyl (meth)acrylate.

Examples of the aminoalkoxyalkyl group-containing (meth)acrylic esters include 2-(dimethylaminoethoxy)ethyl (meth) acrylate, 2-(diethylaminoethoxy)ethyl (meth)acrylate and 3-(dimethylaminoethoxy)propyl (meth)acrylate.

Examples of the N-aminoalkyl group-containing (meth) acrylic amides include N-(2-dimethylaminoethyl) (meth) acrylamide, N-(2-diethylaminoethyl) (meth)acrylamide, N-(2-dimethylaminopropyl) (meth)acrylamide and N-(3-dimethylaminopropyl) (meth)acrylamide.

Of these monomers, 2-dimethylaminoethyl (meth)acrylate, N-(2-dimethylaminoethyl) (meth)acrylamide and N-(3-dimethylaminopropyl) (meth)acrylamide are preferable.

The cationic monomer may be in the form of a salt wherein methyl chloride, dimethyl sulfate, diethyl sulfate or the like is added to the cationic monomer. When the cationic monomer is in the form of such a salt, preferable is a salt wherein methyl chloride is added to the cationic monomer.

The another monomer is, for example, an aromatic vinyl compound, an unsaturated nitrile compound, a (meth)acrylic ester (except (meth)acrylic ester corresponding to the above-mentioned cationic monomer), a conjugated diene compound, a vinyl ester of carboxylic acid or vinyl halide.

Examples of the aromatic vinyl compounds include styrene, α-methylstyrene, p-methylstyrene and styrene halide.

Examples of the unsaturated nitrile compounds include acrylonitrile.

Examples of the (meth)acrylic esters (except those corresponding to the cationic monomers) include methyl (meth) acrylate, ethyl (meth)acrylate, butyl (meth)acarylate, cyclohexyl (meth)acrylate, 2-ethylhexyl (meth)acrylate, lauryl (meth)acrylate, glycidyl (meth)acrylate and 2-hydroxyethyl (meth)acrylate.

Examples of the conjugated diene compounds include butadiene and isoprene.

Examples of the vinyl esters of carboxylic acids include vinyl acetate.

Examples of the vinyl halides include vinyl chloride and vinylidene chloride.

Of these monomers, styrene, α-methylstyrene, acrylonitrile, methyl methacrylate, butyl methacrylate and 2-hydroxyethyl acrylate are preferable.

Further, a monomer having two or more polymerizable unsaturated bonds may be copolymerized when needed.

Examples of such monomers include divinylbenzene, divinylbiphenyl, ethylene glycol di(meth)acrylate, diethylene glycol di(meth)acrylate, triethylene glycol di(meth)acrylate, tetraethylene glycol di(meth)acrylate, propylene glycol di(meth)acrylate, dipropylene glycol di(meth)acrylate, tripropylene glycol di(meth)acrylate, tetrapropylene glycol di(meth)acrylate, 1,4-butanediol di(meth)acrylate, 1,6-hexanediol di(meth)acrylate, neopentyl glycol di(meth)acrylate, 2,2'-bis[4-(meth)acryloyloxypropioxyphenyl]propane, 2,2'-bis[4-(meth)acryloyloxydiethoxydiphenyl]propane, glycerol tri(meth)acrylate, trimethylolpropane tri(meth)acrylate and pentaerythritol tetra(meth)acrylate.

Of these, divinylbenzene, ethylene glycol dimethacrylate and trimethylolpropane tri(meth)acrylate are preferable.

When the cationic organic particles are particles of a copolymer of a cationic monomer and another monomer, the amount of the cationic monomer used as a raw material is in the range of preferably 1 to 60% by mass, more preferably 1 to 20% by mass, based on the total amount of the monomers.

The above polymer can be prepared by a publicly known process using a radical polymerization initiator. Examples of the radical polymerization initiators include benzoyl peroxide, potassium persulfate, ammonium persulfate and 2,2'-azobisisobutyronitrile.

The polymer having a cationic residue at the terminal can be prepared by using a polymerization initiator having residue that remains at the terminal of a polymer and become a cationic residue (sometimes referred to as a "cationic polymerization initiator" hereinafter) as a polymerization initiator. In the preparation, a polymer having cationic residues both of in the side chain and at the terminal of the polymer can be obtained by polymerization wherein a cationic monomer is used as a part or all of raw material monomers, for example, homopolymerization or copolymerization of the cationic monomer, or copolymerization of the cationic monomer and another monomer mentioned above. A polymer having a cationic residue only at the terminal of the polymer can be obtained by polymerization wherein a non-cationic is used as a raw material monomer, for example, homopolymerization or copolymerization of a monomer other than the above cationic monomer. Further, in the above polymerizations, a monomer having two or more polymerizable unsaturated bonds may be copolymerized when needed.

Examples of the cationic polymerization initiators include
2,2'-azobis(2-methyl-N-phenylpropionamidine) dihydrochloride (commercially available from Wako Pure Chemical Industries, Ltd. under the trade name of "VA-545"),
2,2'-azobis[N-(4-chlorophenyl)-2-methylpropionamidine] dihydrochloride (commercially available from Wako Pure Chemical Industries, Ltd. under the trade name of "VA-546"),
2,2'-azobis[N-(4-hydroxyphenyl)-2-methylpropionamidine] dihydrochloride (commercially available from Wako Pure Chemical Industries, Ltd. under the trade name of "VA-548"),
2,2'-azobis[2-methyl-N-(phenylmethyl)propionamidine] dihydrochloride (commercially available from Wako Pure Chemical Industries, Ltd. under the trade name of "VA-552"),
2,2'-azobis[2-methyl-N-(2-propenyl)propionamidine] dihydrochloride (commercially available from Wako Pure Chemical Industries, Ltd. under the trade name of "VA-553"),
2,2'-azobis(2-methylpropionamidine) dihydrochloride (commercially available from Wako Pure Chemical Industries, Ltd. under the trade name of "V-50"),
2,2'-azobis[N-(2-hydroxyethyl)-2-methylpropionamidine] dihydrochloride (commercially available from Wako Pure Chemical Industries, Ltd. under the trade name of "VA-558"),
2,2'-azobis[N-(2-carboxyethyl)-2-methylpropionamidine] hydrate (commercially available from Wako Pure Chemical Industries, Ltd. under the trade name of "VA-057"),
2,2'-azobis[2-methyl-(5-methyl-2-imidazolin-2-yl)propane] dihydrochloride (commercially available from Wako Pure Chemical Industries, Ltd. under the trade name of "VA-041"),
2,2'-azobis[2-(2-imidazolin-2-yl)propane] dihydrochloride (commercially available from Wako Pure Chemical Industries, Ltd. under the trade name of "VA-044"),
2,2'-azobis[2-(4,5,6,7-tetrahydro-1H-1,3-diazepin-2-yl)propane] dihydrochloride (commercially available from Wako Pure Chemical Industries, Ltd. under the trade name of "VA-054"),
2,2'-azobis[2-(3,4,5,6-tetrahydropyrimidin-2-yl)propane] dihydrochloride (commercially available from Wako Pure Chemical Industries, Ltd. under the trade name of "VA-058"),
2,2'-azobis[2-(S-hydroxy-3,4,5,6-tetrahydropyrimidin-2-yl) propane] dihydrochloride (commercially available from Wako Pure Chemical Industries, Ltd. under the trade name of "VA-059"),
2,2'-azobis{2-[1-(2-hydroxyethyl)-2-imidazolin-2-yl]propane} dihydrochloride (commercially available from Wako Pure Chemical Industries, Ltd. under the trade name of "VA-060"), and
2,2'-azobis[2-(2-imidazolin-2-yl)propane] (commercially available from Wako Pure Chemical Industries, Ltd. under the trade name of "VA-061").

Of these initiators, 2,2'-azobis(2-methylpropionamidine) dihydrochloride (trade name "V-50"), 2,2'-azobis[N-(2-carboxylethyl)-2-methylpropionamidine] hydrate (trade name "VA-057") or 2,2'-azobis[2-(2-imidazolin-2-yl)propane] dihydrochloride (trade name "VA-044") are preferably employed.

In the case where the cationic organic particles are polymer particles to which a surfactant having a cationic residue has adhered, the polymer has preferably a neutral or anionic residue. Such a polymer can be prepared by homopolymerization of another monomer mentioned above or a monomer having an anionic residue, or copolymerization of two or more monomers of another monomer, a monomer having two or more polymerizable unsaturated bonds and a monomer having an anionic residue, according to a publicly known process using the aforesaid radical polymerization initiator (that is not the aforesaid cationic polymerization initiator).

The monomer having an anionic residue employable is, for example, the aforesaid vinyl ester of carboxylic acid. The monomer having an anionic residue is herein used in an amount of preferably 1 to 60% by mass, more preferably 1 to 30% by mass, based on the total amount of the monomers.

Examples of the surfactants having a cationic residue include alkylpyridinyl chloride, alkylamine acetate, alkylammonium chloride, alkylamine, and reactive cationic surfactants described in Japanese Patent Laid-Open Publication No. 60-235631/1985, such as diallylammonium halide.

The surfactant having a cationic residue is used in an amount of preferably 10 to 300 parts by mass, more preferably 10 to 100 parts by mass, based on 100 parts by mass of the polymer.

The surfactant can be allowed to adhere to the polymer by an appropriate method. For example, a dispersion containing polymer particles is prepared, and to the dispersion, a solution of a surfactant is added, whereby adhesion of the surfactant to the polymer can be carried out.

The cationic organic particles have an average dispersed particle diameter of preferably smaller than 1.0 µm, more preferably not smaller than 0.02 and smaller than 1.0 µm, particularly preferably not smaller than 0.04 and not larger than 0.6 µm. Further, the average dispersed particle diameter of the cationic organic particles is preferably almost the same level as that of ceria and is more preferably 60 to 200% of the average dispersed particle diameter of ceria. The average dispersed particle diameter can be measured by dynamic light scattering method, laser scattering diffractometry, observation by transmission electron microscope, or the like.

The abrasives contained in the chemical mechanical polishing aqueous dispersion of the invention can be obtained by mixing the ceria with the cationic organic particles. Mixing of the ceria with the cationic organic particles may be carried out by any of the following methods. (1) An aqueous dispersion containing the ceria and an aqueous dispersion containing the cationic organic particles are each independently prepared, and these aqueous dispersions are mixed. (2) An aqueous dispersion containing one of the ceria and the cationic organic particles is prepared, and to the aqueous dispersion, the other in the form of solid (or powder) is added. (3) The both components each being in the form of solid (or powder) are mixed, and the mixture is dispersed in an aqueous medium. Of these methods, the method (1) is preferable.

In case of the method (1), it is possible that a chemical mechanical polishing aqueous dispersion prepared by previously mixing an aqueous dispersion containing the ceria with an aqueous dispersion containing the cationic organic particles is used for chemical mechanical polishing, or it is also possible that an aqueous dispersion containing the ceria and an aqueous dispersion containing the cationic organic particles are each prepared and they are brought into contact with each other in a line of a chemical mechanical polishing apparatus or on a polishing pad and thereby mixed to form abrasives.

The amount of the cationic organic particles used is not more than 100 parts by mass, preferably 1 to 100 parts by mass, more preferably 1 to 50 parts by mass, still more preferably 1 to 20 parts by mass, based on 100 parts by mass of the ceria.

The abrasives obtained as above comprise ceria and have an average dispersed particle diameter of not less than 1.0 μm. The average dispersed particle diameter is preferably 1.0 to 10 μm, more preferably 1.0 to 5.0 μm, still more preferably 1 to 2.5 μm. The average dispersed particle diameter can be measured by dynamic light scattering method, laser scattering diffractometry, observation by transmission electron microscope, or the like.

The ceria preferably forms composite particles together with cationic organic particles. The formation of the composite particles is not specifically restricted, and the ceria and the cationic organic particles which are different in the sign of zeta-potential are preferably bonded by the electrostatic force. The formation of the composite particles can be observed by increase in the average dispersed particle diameter of the abrasives relative to that of each ceria and that of cationic organic particles.

The chemical mechanical polishing aqueous dispersion of the invention comprises the abrasives in an amount of not more than 1.5% by mass. This content is preferably 0.1 to 1.5% by mass, more preferably 0.5 to 1.0% by mass.

The chemical mechanical polishing aqueous dispersion of the invention comprises the abrasives comprising ceria and having an average dispersed particle diameter of not less than 1.0 μm, and in addition, a water-soluble organic polymer having anionic groups, an acid, a base or the like can be arbitrarily added.

The water-soluble organic polymer having anionic groups can be added in order to enhance dispersion stability of the abrasives and simultaneously in order to further reduce occurrence of surface defects of a polished surface. Examples of the anionic groups include a carboxyl group and a sulfone group.

The water-soluble organic polymer having carboxyl groups as anionic groups is, for example, polyglutamic acid or a (co)polymer of an unsaturated carboxylic acid. The water-soluble organic polymer having sulfone groups as anionic groups is, for example, a (co)polymer of an unsaturated monomer having sulfone groups.

The unsaturated carboxylic acid (co)polymer is a homopolymer of an unsaturated carboxylic acid or a copolymer of an unsaturated carboxylic acid and another monomer. The unsaturated carboxylic acid is, for example, (meth) acrylic acid. The another monomer is, for example, (meth) acrylamide, (meth)acrylic ester, styrene, butadiene or isoprene. Examples of the (meth)acrylic esters include methyl (meth) acrylate, ethyl (meth) acrylate and benzyl (meth)acrylate.

The (co)polymer of an unsaturated monomer having sulfone groups is a homopolymer of an unsaturated monomer having sulfone groups or a copolymer of an unsaturated monomer having sulfone groups and another monomer. Examples of the unsaturated monomers having sulfone groups include styrenesulfonic acid, naphthalenesulfonic acid and isoprenesulfonic acid. As the another monomer, the same monomer as previously exemplified as a raw material of the unsaturated carboxylic acid copolymer can be employed.

Of the above water-soluble organic polymers having anionic groups, unsaturated carboxylic acid (co)polymers are preferably employed, and poly(meth)acrylic acid is particularly preferably employed.

As the water-soluble organic polymer having anionic groups, a polymer in which a part or all of anionic groups contained form salts may be used. In this case, the counter cation is, for example, an ammonium ion, an alkylammonium ion or a potassium ion.

The water-soluble organic polymer having anionic groups contained in the chemical mechanical polishing aqueous dispersion of the invention has a weight-average molecular weight in terms of polyethylene glycol, as measured by gel permeation chromatography using water as a solvent, of preferably 3,000 to 30,000, more preferably 4,000 to 20,000, still more preferably 5,000 to 11,000. By the use of the water-soluble polymer having anionic groups and having a weight-average molecular weight of this range, the effect that dispersion stability of the abrasives is enhanced and at the same time occurrence of surface defects of a polished surface is further reduced is exerted.

In the chemical mechanical polishing aqueous dispersion of the invention, the water-soluble organic polymer having anionic groups is added in an amount of preferably not more than 600 parts by mass, more preferably 60 to 600 parts by mass, still more preferably 60 to 500 parts by mass, particularly preferably 60 to 450 parts by mass, relative to 100 parts by mass of the abrasives comprising ceria and having an average dispersed particle diameter of not less than 1.0 μm. By the use of the water-soluble polymer in an amount of this range, a chemical mechanical polishing aqueous dispersion having an excellent balance between dispersion stability of the abrasives and a removal rate can be obtained.

The acid can be added in order to control pH, and can enhance stability of the chemical mechanical polishing aqueous dispersion of the invention and can further improve a removal rate. The acid is not specifically restricted, and any of an organic acid and an inorganic acid can be employed. Examples of the organic acids include paratoluenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. Examples of the inorganic acids include nitric acid, hydrochloric acid and sulfuric acid. These organic acids and inorganic acids can be each used singly or in combination of two or more kinds. Further, an organic acid and an inorganic acid can be used in combination.

The acid is used in an amount of preferably not more than 2% by mass, more preferably not more than 1% by mass, based on 100% by mass of the chemical mechanical polishing aqueous dispersion.

The base can be added in order to control pH and in order to further enhance dispersibility of the abrasives and a removal rate. The base is not specifically restricted, and any of an organic base and an inorganic base can be employed.

Examples of the organic bases include nitrogen-containing organic compounds, such as ethylenediamine and ethanolamine. Examples of the inorganic bases include ammonia, potassium hydroxide, sodium hydroxide and lithium hydroxide. These organic bases and inorganic bases can be each used singly or in combination of two or more kinds. Further, an organic base and an inorganic base can be used in combination.

The base is used in an amount of preferably not more than 1% by mass, more preferably not more than 0.5% by mass, based on 100% by mass of the chemical mechanical polishing aqueous dispersion.

The chemical mechanical polishing aqueous dispersion of the invention is prepared in such a state that the above-mentioned constituents are dispersed or dissolved in an appropriate medium. The medium used for the chemical mechanical polishing aqueous dispersion of the invention is, for example, water, a mixed medium of water and an alcohol, a mixed medium of water and an organic solvent other than alcohols. Examples of the alcohols include methanol and ethanol. It is preferable to use water as the medium for the chemical mechanical polishing aqueous dispersion of the invention.

The chemical mechanical polishing aqueous dispersion has pH of preferably 4 to 12. When the pH is in this range, the chemical mechanical polishing aqueous dispersion has a high removal rate and can provide a polished surface having decreased polishing scratches, and moreover, the aqueous dispersion itself has excellent stability.

The chemical mechanical polishing aqueous dispersion of the invention may be prepared in such a state that all of the aforesaid constituents are each contained in the aforesaid recommended amount, or may be prepared in a state of a concentrate with keeping the aforesaid mixing ratios and diluted prior to use for the chemical mechanical polishing.

In the case where the chemical mechanical polishing aqueous dispersion is prepared in a state of a concentrate, it is preferable to control the amount of the abrasives to not more than 20% by mass from the viewpoint of long-term stability of the aqueous dispersion.

Chemical Mechanical Polishing Method

The chemical mechanical polishing method of the invention is to polish an insulating film using the chemical mechanical polishing aqueous dispersion. More specifically, there can be mentioned, for example, polishing of insulating films in the shallow trench isolation process (STI process) or polishing of interlayer insulating films of multilayer wiring substrates.

Examples of the insulating films which are objects of polishing in the STI process and the insulating films of the multilayer wiring substrates include a thermally oxidized film, a PETEOS film (plasma enhanced-TEOS film), a HDP film (high density plasma enhanced-TEOS film), and a silicon oxide film obtained by thermal CVD process, a boron phosphorus silicate film (BPSG film), an insulating film called FSG (fluorine-doped silicate glass) obtained by doping $SiO_2$ with fluorine, a silicon oxide-based low-dielectric constant insulating film, a low-dielectric constant insulating film using an organic polymer as a raw material.

The thermally oxidized film is a film formed by exposing high-temperature silicon to an oxidizing atmosphere to subject silicon and oxygen or silicon and water to chemical reaction.

The PETEOS film is a film formed by chemical vapor deposition using tetraethyl orthosilicate (TEOS) as a raw material and utilizing plasma as acceleration conditions.

The HDP film is a film formed by chemical vapor deposition using tetraethyl orthosilicate (TEOS) as a raw material and utilizing high-density plasma as acceleration conditions.

The silicon oxide film obtained by thermal CVD process is a film formed by an atmospheric pressure CVD process (AP-CVD process) or a low pressure CVD process (LP-CVD process).

The boron phosphorus silicate film (BPSG film) is a film formed by an atmospheric pressure CVD process (AP-CVD process) or a low pressure CVD process (LP-CVD process).

The insulating film called FSG is a film formed by chemical vapor deposition utilizing high-density plasma as acceleration conditions.

The silicon oxide-based low-dielectric constant insulating film can be obtained by coating a substrate with a raw material by, for example, a spin-coating method and then heating the substrate in an oxidizing atmosphere. Examples of the silicon oxide-based low-dielectric constant insulating films obtained as above include a HSQ film (hydrogen silsesquioxane film) using triethoxysilane as a raw material, a MSQ film (methyl silsesquioxane film) using tetraethoxysilane and a small amount of methyltrimethoxysilane as raw materials, and a low-dielectric constant insulating film using another silane compound as a raw material. Further, an insulating film having much lower dielectric constant, which is obtained by mixing proper organic polymer particles with the raw material in the production of a low-dielectric constant insulating film, is also employable. The organic polymer is burnt away to form pores in the heating step, and hence, the insulating film exerts much lower dielectric constant. Examples of the proper organic polymer particles include "NEWPOL PE61" (trade name, available from Sanyo Chemical Industries, Ltd., polyethylene oxide/polypropylene oxide/polyethylene oxide block copolymer).

Examples of the low-dielectric constant insulating films using an organic polymer as a raw material include low-dielectric constant insulating films using an organic polymer, such as a polyarylene-based polymer, a polyarylene ether-based polymer, a polyimide-based polymer or a benzocyclobutene-based polymer, as a raw material.

Of these insulating films, from the viewpoint that the effect of the invention maximized, the PETEOS film, the HDP film, the silicon oxide film obtained by thermal CVD process, the BPSG film and the insulating film called FSG are preferable, and the PETEOS film is particularly preferable.

The chemical mechanical polishing method of the invention can be carried out under appropriate conditions using a commercially available chemical mechanical polishing apparatus. Examples of the commercially available chemical mechanical polishing apparatuses include "EPO-112", "EPO-222" (manufactured by Ebara Corporation) and "Mirra-Mesa" (manufactured by Applied Materials, Inc.).

The chemical mechanical polishing method can apply to polishing of insulating films in the process for manufacturing semiconductor devices. Particularly, the chemical mechanical polishing method can favorably apply to polishing in the process for manufacturing semiconductor devices having the insulating films mentioned above.

EFFECT OF THE INVENTION

According to the present invention, a chemical mechanical polishing aqueous dispersion which can suppress occurrence of polishing scratches without lowering a removal rate in the removal step of insulating films of the process for manufacturing semiconductor devices and a chemical mechanical polishing method capable of removing excess insulating film using the aqueous dispersion in the shallow trench isolation process are provided. According to the method of the invention, by removing excess insulating film in the shallow trench isolation process, surface defects of the polished surface can be decreased, and efficient chemical mechanical polishing can be carried out.

EXAMPLES

The present invention is further described with reference to the following examples, but it should be construed that the invention is in no way limited to those examples.

<Preparation of Water Dispersion of Ceria>

Preparation Example 1

Bastnaesite was dissolved in nitric acid, and then recrystallization in the form of a carbonate was repeated three times to give a carbonate of highly purified cerium. The carbonate was heated in air at 900° C. for 5 hours to give ceria. The ceria is pulverized by a bead mill using zirconia beads and then classified through a hydraulic elutriation.

The ceria particles thus obtained were dispersed in ion-exchanged water in the presence of nitric acid, and pH of the dispersion was adjusted to 6 to give a water dispersion of ceria containing 15% by mass of ceria having an average dispersed particle diameter (secondary particle diameter) of 0.24 µm.

<Synthesis of Organic Particles>

Synthesis Example 1

(Preparation of Water Dispersion Containing Cationic Polymer Particles (a))

In a 2-liter flask, 70 parts by mass of styrene, 20 parts by mass of methyl methacrylate and 10 parts by mass of a methyl chloride adduct of N-(3-dimethylaminopropyl) acrylamide (available from KOHJIN Co., Ltd., trade name: DMAPAAQ) as monomers, 1 part by mass of an azo type polymerization initiator (available from Wako Pure Chemical Industries, Ltd., trade name: V50) as a polymerization initiator, 5 parts by mass of a 27% by mass of aqueous solution of dodecyltrimethylammonium chloride (available from KAO Corporation, trade name: QUARTAMIN 24P) as a surfactant and 400 parts by mass of ion-exchanged water as a solvent were placed. The mixture was heated to 70° C. with stirring in a nitrogen gas atmosphere, followed by polymerization at 70° C. for 6 hours. Thus, an aqueous dispersion containing styrene/methyl methacrylate based copolymer particles (referred to as "cationic polymer particles (a)" hereinafter) having cationic residues and having an average dispersed particle diameter of 0.31 µm was obtained. The polymerization yield was 95%. A zeta potential of the polymer particles (a) was measured by means of a zeta potential analyzer utilizing laser Doppler electrophoretic light scattering method (manufactured by BECKMAN COULTER, Inc., model: DELSA440), and as a result, it was +25 mV.

Comparative Synthesis Example 1

(Preparation of Water Dispersion Containing Anionic Polymer Particles (b))

In a 2-liter flask, 50 parts by mass of styrene, 20 parts by mass of acrylonitrile and 30 parts by mass of methyl methacrylate as monomers, 1 part by mass of ammonium peroxide as a polymerization initiator, 2 parts by mass of polyoxyethylene alkylphenyl ether (available from KAO Corporation, trade name: EMULGEN 920) as a surfactant and 400 parts by mass of ion-exchanged water were placed. The mixture was heated to 70° C. with stirring in a nitrogen gas atmosphere, followed by polymerization at 70° C. for 6 hours. Thus, a water dispersion containing styrene/methyl methacrylate based copolymer particles (referred to as "anionic polymer particles (b)" hereinafter) having anionic residues and having an average dispersed particle diameter of 0.42 µm was obtained. The polymerization yield was 94%. A zeta potential of this polymer particles was measured in the same manner as in Synthesis Example 1, and as a result, it was −16 mV.

Synthesis Examples 2 to 4

Cationic polymer particles (c), (d) and (e) were obtained in the same manner as in Synthesis Example 1, except that the types and the amounts of the monomers, the polymerization initiator and the surfactant were changed as shown in Table 1. Average dispersed particle diameters and zeta potentials of these polymer particles are set forth in Table 1.

<Preparation of Solution Containing Water-Soluble Organic Polymer Having Anionic Group>

Preparation Example 2

To an aqueous solution containing polyacrylic acid (weight-average molecular weight in terms of polyethylene glycol as measured by GPC using water as solvent: 8,000) in an amount of 40% by mass, 28% by mass of ammonia water was added in such an amount as to neutralize 80% of carboxyl groups of the polyacrylic acid.

TABLE 1

| Polymer particles | Synth. Ex. 1 (a) | Comp. Synth. Ex. 1 (b) | Synth. Ex. 2 (c) | Synth. Ex. 3 (d) | Synth. Ex. 4 (e) |
|---|---|---|---|---|---|
| Monomer | | | | | |
| Styrene | 70 | 50 | 30 | 50 | — |
| Acrylonitrile | — | 20 | — | 15 | 60 |
| Methyl methacrylate | 20 | 30 | 70 | 20 | 35 |
| DMAPAAQ | 10 | — | — | 10 | — |
| Divinylbenzene | — | — | — | 5 | 5 |
| Polymerization initiator | | | | | |
| V-50 | 1 | — | 1 | — | 1 |
| Benzoyl peroxide | — | — | — | 1 | — |
| Ammonium persulfate | — | 1 | — | — | — |
| Surfactant | | | | | |
| QUARTAMIN 24P | 5 | — | 1 | — | 2 |
| EMULGEN 920 | — | 2 | — | 1 | — |
| NOIGEN RN20 | — | — | 2 | 2 | 5 |

TABLE 1-continued

| Polymer particles | Synth. Ex. 1 (a) | Comp. Synth. Ex. 1 (b) | Synth. Ex. 2 (c) | Synth. Ex. 3 (d) | Synth. Ex. 4 (e) |
|---|---|---|---|---|---|
| Average particle diameter (μm) | 0.31 | 0.42 | 0.26 | 0.16 | 0.10 |
| Zeta potential | +25 mV | −16 mV | +31 mV | +15 mV | +35 mV |

Note: A numeral corresponding to each component means an amount (part(s) by mass) of the component added in the polymerization reaction.
"—" indicates that a component relevant to the corresponding column was not added.
DMAPAAQ: methyl chloride adduct of N-(3-dimethylaminopropyl) acrylamide (available from KOHJIN Co., Ltd.)
V-50: hydrogen dichloride salt of 2,2'-azobis(2-methylproionamidine) (available from Wako Pure Chemical Industries, Ltd.)
QUARTAMIN 24P: 27% by mass of aqueous solution of dodecyltrimethylammonium chloride (available from KAO Corporation)
EMULGEN 920: polyoxyethylene alkylphenyl ether (available from KAO Corporation)
NOIGEN RN20: nonionic surfactant (available from DAI-ICHI KOGYO SEIYAKU CO., LTD.)

Example 1

(1) Preparation of Chemical Mechanical Polishing Aqueous Dispersion

The water dispersion of ceria prepared in the Preparation Example 1 in an amount corresponding to 10 parts by mass in terms of ceria, the aqueous dispersion containing the cationic polymer particles (a) synthesized in Synthesis Example 1 in an amount corresponding to 2 parts by mass in terms of the cationic polymer particles (a), and the solution containing a water-soluble polymer prepared in the Preparation Example 2 in an amount corresponding to 25% by mass in terms of the water-soluble polymer were mixed to prepare a concentrate of a chemical mechanical polishing aqueous dispersion.

The concentrate was diluted with ultra pure water so that the content of ceria should become 0.8% by mass (corresponding to 0.96% by mass in terms of abrasives comprising ceria), to prepare a chemical mechanical polishing aqueous dispersion. An average dispersed particle diameter of the abrasives contained in the thus prepared chemical mechanical polishing aqueous dispersion was measured by laser diffractometry, and as a result, it was 1.57 μm.

(2) Chemical Mechanical Polishing

Chemical mechanical polishing was carried out using a PETEOS film having a diameter of 8 inches as a polishing target material under the following conditions using the above-prepared chemical mechanical polishing aqueous dispersion.

Polishing apparatus: model "EPO-112", manufactured by Ebara Corporation
Polishing pad: IC1000/SUBA400, available from Rodel Nitta Company
Feed rate of aqueous dispersion: 200 ml/min
Turn table rotating speed: 100 rpm
Polishing head rotating speed: 107 rpm
Polishing head pressure: 450 g/cm$^2$
Polishing time: 3 minutes (3) Evaluation of Removal Rate A film thickness of the polishing target material was measured before and after the chemical mechanical polishing by the use of a optical interferotype film thickness meter "Nano-Spec 6100" (manufactured by Nanometrics Japan Ltd.), and a difference between the resulting values was divided by the polishing time to determine a removal rate. The removal rate is set forth in Table 2.

It was judged that when this value was not less than 20 nm/min, the removal rate was good, and when the value was less than 20 nm/min, the removal rate was bad.

(4) Evaluation of Number of Scratches

The PETEOS film after the polishing was subjected to defect inspection by means of "KLA2351" manufactured by KLA-Tencor Corporation. First, "defects" on the whole surface of the wafer were counted by "KLA2351" under the conditions of a pixel size of 0.39 μm and a threshold value of 50. Then, from these defects, 250 defects were sampled at random, and they were observed to check whether each defect was a scratch or anything except the scratch (e.g. an attached dust). Then, a ratio of the scratches to the "defects" was calculated, and from the ratio, the number of scratches per the whole surface of the wafer was calculated. The result is set forth in Table 2.

It was judged that when this value was not more than 50 scratches/surface, the number of scratches was extremely good, when the value was 51 to 100 scratches/surface, the number of scratches was good, and when the value was not less than 101 scratches/surface, the number of scratches was bad.

Examples 2 to 6, and Comparative Examples 1 to 4

A concentrate was prepared in the same manner as in Example 1, except that the type and the amount of each component were changed as shown in Table 2. Then, a chemical mechanical polishing aqueous dispersion was prepared and evaluated in the same manner as in Example 1. The results are set forth in Table 2.

In Comparative Example 5, the polished surface after the polishing had extremely bad uniformity, and therefore evaluation of scratches was not carried out.

TABLE 2

| | Preparation of concentrate | | | | After dilution | | Evaluation result | |
|---|---|---|---|---|---|---|---|---|
| | Amount of ceria (wt %) | Polymer particles Type | Amount (wt %) | Amount of water-soluble polymer having anionic group (wt %) | Content of ceria (wt %) | Content of abrasives containing ceria (wt %) | Average dispersed particle diameter (μm) | removal rate (nm/min) | Number of scratches (scratches/ surface) |
| Ex. 1 | 10 | (a) cationic | 2 | 25 | 0.8 | 0.96 | 1.57 | 23 | 37 |
| Ex. 2 | 10 | (a) cationic | 1 | 30 | 0.8 | 0.88 | 1.04 | 20 | 80 |

TABLE 2-continued

|  | Preparation of concentrate | | | Amount of water-soluble polymer having anionic group (wt %) | After dilution | | Evaluation result | |
|---|---|---|---|---|---|---|---|---|
|  | Amount of ceria (wt %) | Polymer particles | | | Content of ceria (wt %) | Content of abrasives containing ceria (wt %) | Average dispersed particle diameter (µm) | removal rate (nm/min) | Number of scratches (scratches/surface) |
|  | | Type | Amount (wt %) | | | | | | |
| Ex. 3 | 10 | (a) cationic | 5 | 15 | 0.8 | 1.20 | 2.43 | 26 | 15 |
| Ex. 4 | 10 | (c) cationic | 2 | 25 | 0.8 | 0.96 | 1.76 | 26 | 63 |
| Ex. 5 | 10 | (d) cationic | 2 | 25 | 0.8 | 0.96 | 3.24 | 21 | 48 |
| Ex. 6 | 10 | (e) cationic | 2 | 25 | 0.8 | 0.96 | 1.37 | 22 | 59 |
| Comp. Ex. 1 | 10 | (b) anionic | 2 | 25 | 0.8 | 0.96 | 0.36 | 13 | 278 |
| Comp. Ex. 2 | 10 | — — | — | 30 | 0.8 | 0.80 | 0.32 | 22 | 126 |
| Comp. Ex. 3 | 10 | (b) anionic | 2 | 15 | 0.8 | 0.96 | 0.33 | 26 | 120 |
| Comp. Ex. 4 | 10 | (b) anionic | 3 | 10 | 0.8 | 1.04 | 0.34 | 13 | 297 |
| Comp. Ex. 5 | 10 | — — | — | 25 | 0.8 | 0.80 | 0.30 | 37 | — |

As shown in Table 2, in each of Examples 1 to 6, the removal rate was not less than 20 nm/min and sufficiently high, and besides, the number of scratches was small, and hence, polishing properties and performance are excellent. On the other hand, in each of Comparative Examples 1 and 4, the rate to remove the PETEOS film was insufficient and the number of scratches was large, resulting in a problem. In Comparative Examples 2 and 3, though the removal rate had no problem, the number of scratches was large, so that practical use proved to be difficult. In Comparative Example 5, though the removal rate was satisfactory, uniformity of the polished surface after polishing was extremely bad.

What is claimed is:

1. A chemical mechanical polishing aqueous dispersion comprising abrasives in a concentration of not greater than 1.5% by mass, wherein the abrasives comprise composite particles obtained by mixing ceria and cationic organic particles and have an average dispersed particle diameter of not less than 1.0 µm, the amount of the cationic organic particles mixed being not more than 100 parts by mass relative to 100 parts by mass of the ceria, wherein the cationic organic particles are polymer particles to which a surfactant having a cationic residue is adhered, a polymer of the polymer particles has a neutral or anionic residue, and the cationic residue in the cationic organic particles is positioned in the side chain and/or at the terminal of the polymer, wherein when the polymer has the cationic residue in the side chain, the polymer is obtained by a homopolymerization of a cationic monomer, a copolymerization of two or more cationic monomers or a copolymerization of the cationic monomer and another monomer, when the polymer has the cationic residue at the terminal, the polymer is prepared by using a polymerization initiator having a residue that remains at the terminal of the polymer and becomes the cationic residue, and when the polymer has the cationic residues in the side chain and at the terminal of the polymer, the polymer is obtained by a homopolymerization of the cationic monomer, a copolymerization of the cationic monomer, or a copolymerization of the cationic monomer and another monomer, and wherein the cationic monomer is at least one selected from the group consisting of an aminoalkyl group-containing (meth)acrylic ester, an aminoalkoxyalkyl group-containing (meth)acrylic ester and a N-aminoalkyl group-containing (meth)acrylic amide.

2. The chemical mechanical polishing aqueous dispersion as claimed in claim 1, further comprising an anionic water-soluble organic polymer.

3. A process for preparing the chemical mechanical polishing aqueous dispersion of claim 1, comprising mixing a water dispersion comprising ceria having an average dispersed particle diameter of less than 1.0 µm in an amount of 100 parts by mass in terms of ceria with a water dispersion comprising cationic organic particles having an average dispersed particle diameter of less than 1.0 µm in an amount of not more than 100 parts by mass in terms of cationic organic particles relative to 100 parts by mass of the ceria.

4. A chemical mechanical polishing method comprising polishing an insulating film using the chemical mechanical polishing aqueous dispersion of claim 1.

5. The chemical mechanical polishing method as claimed in claim 4, wherein the insulating film is a PETEOS film, a HDP film, a silicon oxide film obtained by a thermal CVD method, a boron phosphorus silicate film or a fluorine doped silicate glass film.

6. The chemical mechanical polishing aqueous dispersion as claimed in claim 1, wherein the cationic monomer is an aminoalkyl group-containing (meth)acrylic ester selected from the group consisting of 2-dimethylaminoethyl (meth)acrylate, 2-diethylaminoethyl (meth)acrylate, 2-dimethylaminopropyl (meth)acrylate and 3-dimethylaminopropyl (meth)acrylate.

7. The chemical mechanical polishing aqueous dispersion as claimed in claim 1, wherein the cationic monomer is an aminoalkoxyalkyl group-containing (meth)acrylic ester selected from the group consisting of 2-(dimethylaminoethoxy)ethyl (meth)acrylate, 2-(diethylaminoethoxy)ethyl (meth)acrylate and 3-(dimethylaminoethoxy)propyl (meth)acrylate.

8. The chemical mechanical polishing aqueous dispersion as claimed in claim 1, wherein the cationic monomer is a N-aminoalkyl group-containing (meth)acrylic amide selected from the group consisting of N-(2-dimethylaminoethyl) (meth)acrylamide, N-(2-diethylaminoethyl) (meth)acrylamide, N-(2-dimethylaminopropyl) (meth)acrylamide and N-(3-dimethylaminopropyl) (meth)acrylamide.

* * * * *